US006246343B1

United States Patent
Deng et al.

(10) Patent No.: US 6,246,343 B1
(45) Date of Patent: Jun. 12, 2001

(54) INCREMENT ENCODER FAILURE DETECTION

(75) Inventors: Doug D. Deng, Canton; Kenneth James Farkas, Dearborn, both of MI (US)

(73) Assignee: Ford Global Technologies, Inc., Dearborn, MI (US)

( * ) Notice: Subject to any disclaimer, the term of this patent is extended or adjusted under 35 U.S.C. 154(b) by 0 days.

(21) Appl. No.: 09/263,303

(22) Filed: Mar. 5, 1999

(51) Int. Cl.$^7$ ..................................... H03M 1/22
(52) U.S. Cl. .................... 341/11; 341/6; 377/17
(58) Field of Search ..................... 714/736, 738; 341/1, 2, 3, 6, 9, 11, 13, 118, 120; 377/17, 28, 24, 43, 45, 47, 55

(56) References Cited

U.S. PATENT DOCUMENTS

| 4,461,015 | * | 7/1984 | Kulhavy | 377/24 |
| 4,597,081 | | 6/1986 | Tassone | 341/6 |
| 4,796,005 | | 1/1989 | Ishida et al. | 341/11 |
| 4,882,529 | | 11/1989 | Kobari et al. | 318/602 |
| 5,058,145 | * | 10/1991 | Hauck et al. | 377/17 |
| 5,128,536 | | 7/1992 | Higashi | 250/231.16 |
| 5,345,048 | * | 9/1994 | Towey, Jr. | 187/116 |
| 5,650,779 | | 7/1997 | Sugden | 341/9 |

FOREIGN PATENT DOCUMENTS

2249446 * 5/1992 (GB).
2252820 * 8/1992 (GB).

* cited by examiner

Primary Examiner—Emmanuel L. Moise
(74) Attorney, Agent, or Firm—Jennifer Stec

(57) ABSTRACT

An error detection method for use with a two channel increment encoder. The error detection method operates to detect errors over a wide range of rotational velocity of a rotating member. The error detection method employs the signal from one or two of the channels of the encoder and determines if pulse edges from the signals deviate from expected normal behavior. When an error is detected, actions can then be taken by the controller for the rotating member to prevent undesired results.

14 Claims, 3 Drawing Sheets

INCREMENT ENCODER FAILURE DETECTION

FIELD OF THE INVENTION

The present invention relates to encoders and more particularly to detection of errors in increment encoders.

BACKGROUND OF THE INVENTION

A typical use for an encoder is to determine the rotational velocity and/or position of a rotating object, typically a shaft. In certain applications, the need arises to ensure that the encoder has not failed during operation and so error detection is needed. Otherwise, the functional failure of a shaft encoder can cause abnormal behaviors of the machine in which the shaft operates such as shaft speed vibration, wrong rotating direction, undesirable acceleration, and other concerns. The abnormalities can then result in processed parts out of tolerance, damaged parts, as well as wrong direction rotation for moving parts on machines.

One solution is disclosed in U.S. Pat. No. 4,597,081 wherein an optical encoder interface performs error checking on each full revolution of the encoder. The pulses per revolution are counted and compared to a reference number that should occur in one revolution with a properly operating system. This error detection operates on an encoder with a three channel signal where an index revolution bit (a Z-bit) is employed to determine when a complete revolution has occurred. The error detection capability is implemented in the hardware of the electronic assembly itself. However, this solution has limitations that are not always desirable. Such as, the error detection is built into the hardware itself, thus limiting its adaptability and use in retrofitting existing assemblies. Also, this error detection assembly requires a three channel signal, and thus cannot be employed with two channel encoder applications. This adds to the cost and complexity if one wishes to operate an encoder with this error detection. And further, the error detection determination can only be made once every revolution of the shaft, thus limiting how quickly the error will be detected.

Consequently, it is desired to have a system with an encoder that accomplishes error detection but does not have the above noted drawbacks.

SUMMARY OF THE INVENTION

In its embodiments, the present invention contemplates an error checking method for use with a rotating member having a two channel encoder mounted in proximity thereto that produces signals from a first channel and a second channel, each producing pulses. The method comprising the steps of: receiving the signals from one of the first and second channels; determining a counting time interval; counting the number of pulses during the time interval; comparing the number of pulses counted to a predetermined expected number of pulses; and detecting an error if the number of pulses counted is not equal to the expected number of pulses.

Accordingly, an object of the present invention is to provide the capability to detect failures in a two channel increment encoder.

An advantage of the present invention is that a two channel encoder can be monitored during operation over a wide speed range to detect a failure.

Another advantage of the present invention is that the cost associated with the encoder and its error detection is minimized.

A further advantage of the present invention is that the error detection is accomplished with software, thereby allowing for a system that is easily adaptable for other encoder applications, and can be retrofitted to similar existing two channel encoder applications.

An additional advantage of the present invention is that there is not the requirement of a full revolution before each error check, thus allowing for faster error detection.

Another advantage of the present invention is that the error detection system can determine which channel has failed.

DETAILED DESCRIPTION OF THE PREFERRED EMBODIMENTS

Figure 1:
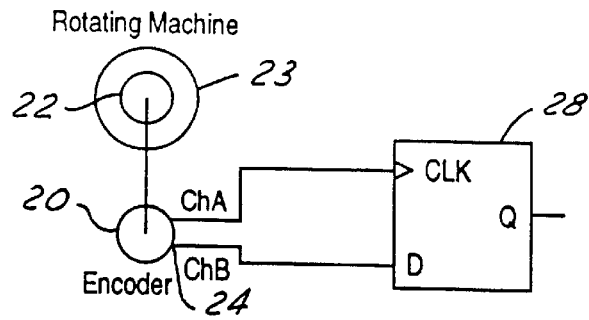
FIG. 1 is a schematic view of a portion of an encoder system assembly in accordance with the present invention.
Figure 2:
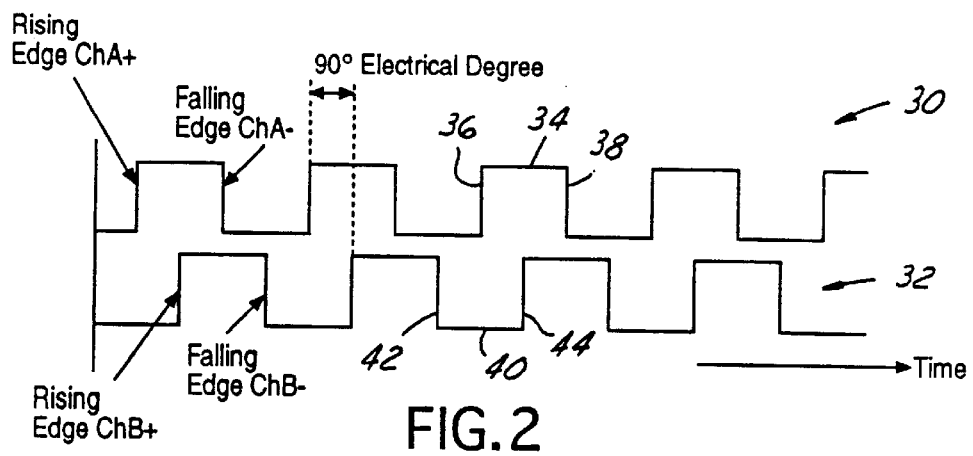
FIG. 2 is a schematic view of signals from channels A and B in accordance with the system of FIG. 1.

FIGS. 1 and 2 illustrate the operation of a two channel increment encoder 20 employed for sensing the rotational speed or position of a shaft or rotating portion 22 of a machine 23. The increment encoder 20 includes two quadrant outputs 24, referred to herein as channel A and channel B. These channels 24 feed into, for example, a D-type edge triggered flip-flop 28. The pulse signal 30 of encoder channel A and the pulse signal 32 of encoder channel B are illustrated in FIG. 2. These signals are usually ninety degree phase shifted from one another. Each pulse 34 of the channel A signal 30 includes a rising edge 36 and a falling edge 38; likewise a pulse 40 from channel B has a rising edge 42 and a falling edge 44, as is known in the art.

For speed detection, the rotating angle is divided by the time elapsed for the angle. The rotating angle is determined by the number of pulses. The direction of rotation is detected from the two pulse signals by employing the flip-flop 28, with an output Q indicative of rotation in one direction or the other.

Figure 3:
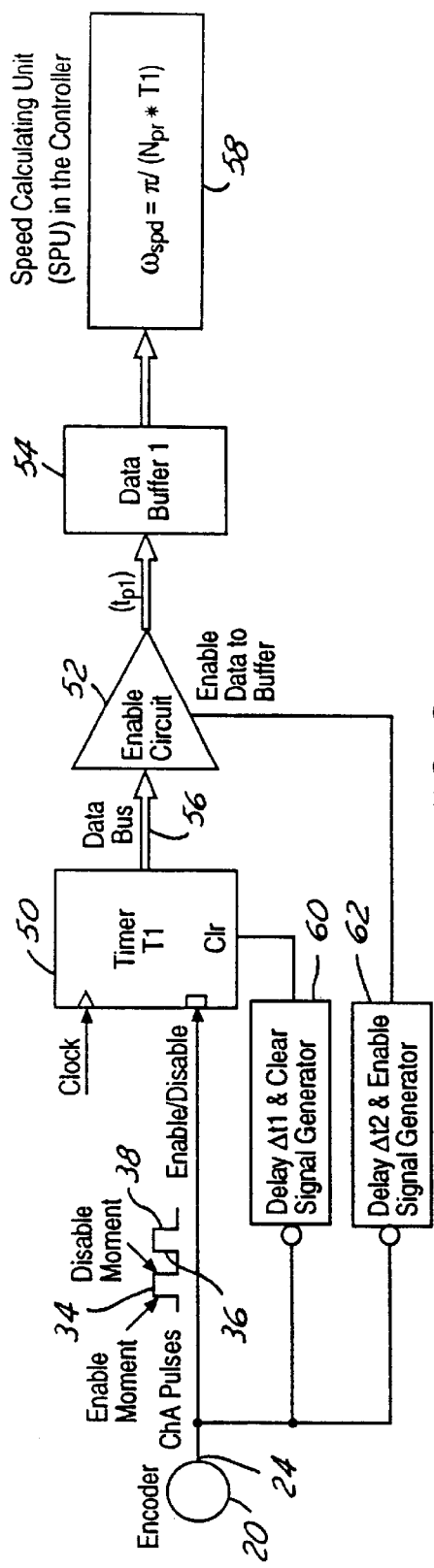
FIG. 3 is a schematic view of a sampling and speed calculation strategy for a generally low rotational speed range in accordance with the present invention.
Figure 4:
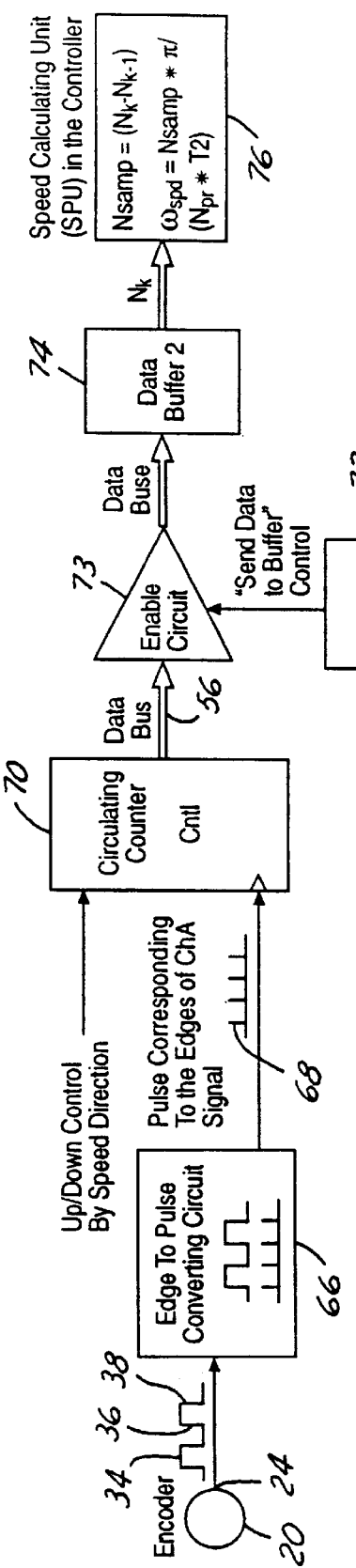
FIG. 4 is a schematic view of a sampling and speed calculation strategy, similar to FIG. 3, but for a high rotational speed range.

For a particular two channel encoder application, there may be the need for accurately detecting rotational speed where high rotational speeds may be involved. For different ranges of rotational speed, the encoder calculation may be different. The error detection must be able to operate under both conditions. FIG. 3 illustrates an encoder speed calculation for a low speed application, while FIG. 4 illustrates a speed calculation for a high speed calculation. A rotational speed boundary $\omega_{bd}$ separates the high and low speed ranges. In a speed range below the boundary $\omega_{bd}$, call it SRL, the time elapsed with a fixed angular angle is sampled, while for the speed range above the boundary $\omega_{bd}$, call it SRH, the angle traveled in a fixed time period is sampled. This distinction assures that the rotational velocity measurements will be accurate for both low and high ranges of rotational speed.

FIG. 3 illustrates the sampling and speed calculation strategy in the low speed range (SRL) for the first channel, channel A. These operations are in addition to the channel A and B signals being fed into the flip-flop 28 illustrated in FIG. 1. While channel B is not shown, it is the same as for channel A and so is not illustrated separately.

The encoder 20 produces the pulses 34 that are sent to three circuit elements. The first one is a timer 50. At the moment when the rising edge 36 of the pulse 34 occurs, the timer 50 starts counting time T1, and at the moment when the falling edge 38 of the pulse 34 occurs the timer 50 stops counting the time T1. This time T1 represents the time used for the rotating part in the encoder 20 to travel the angle between the two edges 36, 38. This data is transferred through enable circuitry 52 and a data buffer 54, via a data bus 56, to a speed calculating unit 58, generally located within the controller for the particular machine in which the shaft is operating. The angular speed $\omega_{spd}$ is then determined within the speed calculating unit 58 by the equation $\omega_{spd} = (\pi/N_{pr})/T1$, where N is the pulse number per revolution of channel A (or channel B as the case may be) and $\pi/N_{pr}$ represents the shaft angle between the two adjacent edges of a pulse 34. The channel A pulse 34 is also sent through a first delay circuit 60 which generates a trigger signal at the falling edge of pulse A to clear the timer 50 after a time delay $\Delta t1$. A second delay circuit 62 receives the falling edge of the channel A pulse 34 and enables the signal generator circuit 52 after a delay time $\Delta t2$, which is longer than delay time $\Delta t1$.

FIG. 4 illustrates the operation of the encoder system similar to FIG. 3, but for the high speed range (SRH). For this speed range, it is preferred that only the A or B channel is used in order to reduce the amount of data that must be processed. While this FIG. illustrates Channel A, it can be accomplished with just channel B instead. The sampling and speed calculation strategy begins with the channel A pulse 34 being generated by the encoder 20 to a converting circuit 66 which converts the rising 36 and falling 38 edges into pulses 68. A circulating counter 70 accumulates encoder pulses 68 that it receives and tracks the total as cnt1. Timer software or circuitry 72 controls the data transfer via the data bus 56 from the circulating counter 70 to a second data buffer 74 through enable circuitry 73 with a time interval of T2. The signal is then transferred to a speed calculating unit 76, which is typically located within a controller for the particular machine being monitored.

The angular speed $\omega_{spd}$ is now calculated in the unit 76 by employing the equation $\omega_{spd} = N_{samp}*(\pi/N_{pr})/T2$, where $N_{pr}$ is the pulse number per revolution of channel A of the encoder 20, and $N_{samp}$ is the edge number of Channel A obtained in the sampling period T2. (Thus, $N_{samp} = N_k - N_{k-1}$, where $N_k$ is the current reading of the pulse number in the second buffer 74, and $N_{k-1}$ is the previous reading of the pulse number in the second buffer 74.)

Figure 5:
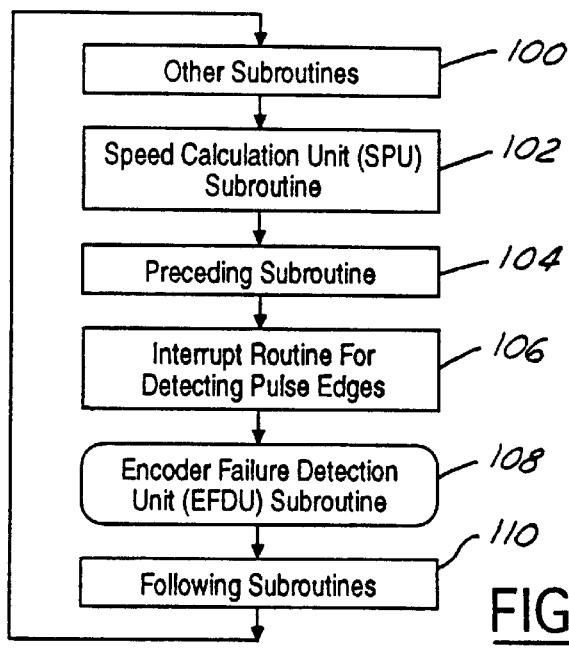
FIG. 5 is a flow chart illustrating the routines operating on the increment encoder in accordance with the present invention.

FIG. 5 illustrates the flow chart for the operation of the encoder circuit. Other subroutines may be running for this particular machine or microprocessor circuitry, step 100, when the software initiates the speed calculation unit subroutine, step 102. This will operate to produce speed and direction information as is described above in relation to FIGS. 1–4. Another subroutine, step 104, may or may not be run after the speed calculation 102 and before the interrupt routine for detecting pulse edges, step 106. These pulse edges will then be employed, as needed, in the next subroutine to execute the encoder failure detection unit, step 108. The processor then continues processing other subroutines, if present, within the machine's controller, step 110. The circulating time to execute steps 100 through 110 should be less than $t_{p1}$ and $t_{p2}$, (sampling periods that will be discussed below).

Figure 6:
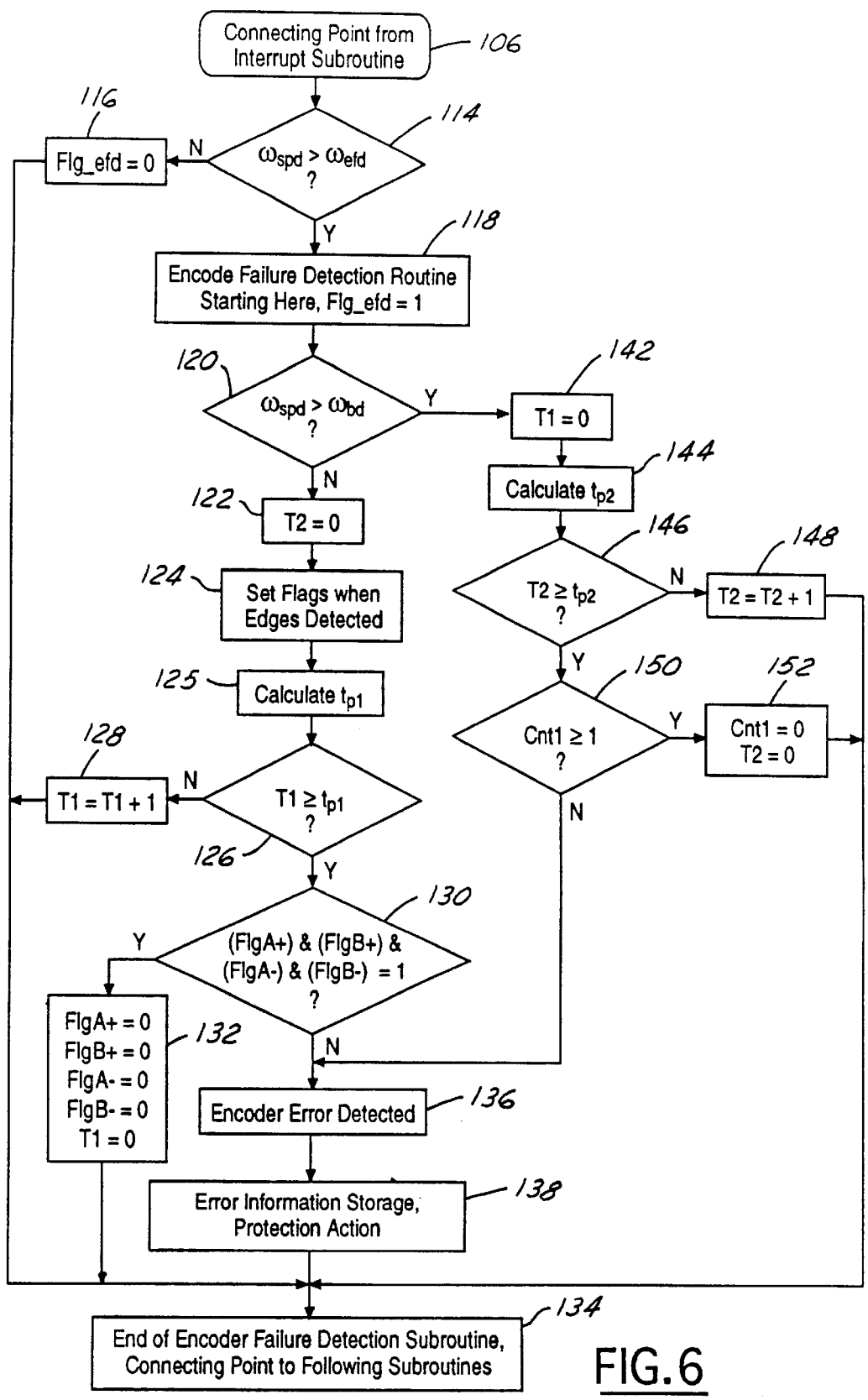
FIG. 6 is a flow chart illustrating details of a portion of the flow chart of FIG. 5

The actual detection of encoder failure takes place within the encoder failure detection unit subroutine 108. The operation of this subroutine is illustrated in detail in FIG. 6. In general, the subroutine is monitoring, over a wide speed range, one or both of the two quadrant outputs for deviation from expected normal behavior to assess the operational validity or failure of the encoder.

First, the rotational speed $\omega_{spd}$, which is found in the speed calculation subroutine 102, in FIG. 5, (as determined by the processes described in FIGS. 3 and 4), is compared to a predetermined minimum rotational speed value $\omega_{efd}$, step 114. The particular minimum rotational speed is application specific and depends upon the type of machine and the rotational speeds at which it operates. If the $\omega_{spd}$ is not greater than $\omega_{efd}$ then the rotational speed is too low and a flag $Flg_{efd}$ is set to zero, step 116, and the encoder failure subroutine 108 is bypasses. If, on the other hand, $\omega_{spd} > \omega_{efd}$, then $Flg_{efd}$ is set to one, step 118, and the error detection will take place.

The rotational speed $\omega_{spd}$ is compared to the rotational speed boundary $\omega_{bd}$, step 120, with $\omega_{bd}$ being the boundary between the low rotational speed range (SRL) and the high rotational speed range (HRL) as discussed above relative to FIGS. 3 and 4. If $\omega_{spd}$ is not greater than $\omega_{bd}$, then the error detection for the SRL is conducted. (This follows the rotational speed calculation that is described in relation to FIG. 3). The timer T2 is set to zero, step 122; after this step, the rising and falling edges of the pulses 34, 40 (see FIG. 2) are tracked and when an edge is detected, an edge flag will be set to one. There are four possible flags, the rising edge 36 of channel A (EgA+), the falling edge of channel A, (EgA−), the rising edge 42 of channel B (EgB+), and the falling edge 44 of channel B (EgB−), step 124.

Next, a preset sampling period $t_{p1}$ is determined, step 125, and the time interval T1 in timer 50 (in FIG. 3) is compared to $t_{p1}$, step 126. The length of $t_{p1}$ is preferably determined differently, depending upon not only the rotational speed of the rotating shaft being measured but also by whether the shaft is accelerating, decelerating or maintaining a generally constant speed. For example, under a generally constant rotational speed condition, the preset sampling period is preferably determined by the equation $t_{p1} > 2\pi/(\omega^2_{efd}*N_{pr})$. The sampling period must be larger than this value in order to assure that false errors are not detected. In another example, under a rotational deceleration condition, the minimum time needed for the sampling period is determined by the following equation $t_{p1} > [(\omega_{efd} - 4*\pi*T_{qmax}/J*N_{pr})^{1/2} - \omega_{efd}]*J/T_{qmax}$; where $T_{qmax}$ is the maximum shaft driving torque, and J is the rotating inertia of the shaft. Of course, these terms will need to be determined based on the particular machine to which this encoder system is applied.

If T1 is not greater than $t_{p1}$, then T1 is incremented, step 128, and the encoder detection failure subroutine ends. If T1 > $t_{p1}$, then a check is made to determine if the flag for each of the pulse edges is one, step 130, meaning that each of the pulse edges was received within the preset sampling period $t_{p1}$. If the flags for all four pulse edges are one, then the flags and T1 are reset to zero, step 132, and the encoder failure detection subroutine ends, step 134. If, on the other hand, one or more of the four pulse edge flags are not one, then an encoder error is detected, step 136, and the error information is stored with protection action taken as is appropriate for the particular machine, step 138. The encoder failure detection subroutine then ends 134.

A different error detection routine is followed when in the High rotational speed range. This is because as the rotational speed increases, the time between pulse edges decreases, and above a certain rotational speed, the execution speed needed to handle the data may be over the execution limit of whatever microprocessor is employed in the controller of the particular machine. This portion of the encoder failure detection subroutine corresponds to the encoder speed calculation illustrated in FIG. 4. If $\omega_{spd} > \omega_{bd}$, step 120, T1 is set equal to zero step 142. Next, a second preset sampling period tp2 is calculated, step 144. The time interval should meet the conditions of the equation $t_{p2} > 2\pi/(\omega_{bd}*N_{pr})$. The time T2 is now compared to time interval $t_{p2}$, step 146. If T2 is not greater than or equal to $t_{p2}$ then T2 is incremented by one, step 148, and the encoder failure detection subroutine ends 134. If T2 is greater than or equal to $t_{p2}$ then the value cnt1 in the circulating counter is compared to one, step 150. If greater than or equal to one then cnt1 and T2 are reset to zero, step 152, and the routine proceeds to the end 134. If not greater than or equal to one, then an encoder error is detected 136, and the error information is stored and protection actions are taken 138. At this point the subroutine ends 134. In this way, error detection is accomplished for the encoder in both the high and low speed ranges.

While certain embodiments of the present invention have been described in detail, those familiar with the art to which this invention relates will recognize various alternative designs and embodiments for practicing the invention as defined by the following claims.

We claim:

1. An error checking method for use with a rotating member having a two channel encoder mounted in proximity thereto that produces signals from a first channel and a second channel, each producing pulses, the method comprising the steps of:
   receiving the signals from one of the first and second channels;
   determining a counting time interval;
   counting the number of pulses during the time interval;
   comparing the number of pulses counted to a predetermined expected number of pulses; and
   detecting an error if the number of pulses counted is not equal to the expected number of pulses.

2. The method of claim 1 wherein the step of determining the time interval includes determining the time interval based upon the rotational characteristics of the rotating member.

3. The method of claim 2 wherein the rotational characteristics are the rotational velocity and rotational acceleration of the rotating member.

4. The method of claim 3 wherein the time interval is greater than $2\pi/(\omega_{efd}*N_{pr})$ for a rotating member that is rotating at an approximately constant speed, and the time interval is greater than $[(\omega^2_{efd} - 4*\pi*T_{qmax}/J*N_{pr})^{1/2} - \omega_{efd}] *J/T_{qmax}$ for a rotating member that is under a generally decelerating speed condition.

5. The method of claim 3 wherein the time interval is greater than $2\pi/(\omega_{bd}*N_{pr})$.

6. The method of claim 1 further including the steps of determining a rotational speed of the shaft, and performing the error checking only if the rotational speed is greater than a predetermined minimum threshold speed.

7. The method of claim 1 further including the steps of:
   determining the rotational velocity of the rotating member;
   comparing the rotational velocity to a predetermined high speed threshold; and
   if the rotational velocity is below the high speed threshold, the step of counting the number of pulses comprises attempting to detect a rising edge and falling edge of a pulse from the one of the two channels, the step of comparing the number of pulses comprises determining if both the rising and falling edge of the pulse are detected within the counting time interval, and the step of detecting an error comprises detecting an error if both the rising and the falling edge of the pulse are not detected within the counting time interval.

8. The method of claim 7 further including the steps of:
   receiving pulse signals from the other of the first and second channels if the rotational velocity is below the predetermined high speed threshold;
   attempting to detect a rising edge and falling edge of a pulse from the other of the first and second channels;
   determining if both the rising and falling edge from the other of the channels are detected within the counting time interval; and
   detecting an error if both the rising and falling edges of the pulse from the other of the channels are not detected within the counting time interval.

9. The method of claim 1 wherein the step of detecting an error further comprises storing the error detection, and altering the operation of the rotating member due to the error detection.

10. The method of claim 1 further including the steps of:
    determining the rotational velocity of the rotating member;
    comparing the rotational velocity to a predetermined high speed threshold;
    converting the rising edges and the falling edges of the pulses from the one of the first and second channels to a second set of pulses, one pulse in the second set for each of the rising and falling edges, if the rotational velocity is greater than the predetermined high speed threshold; and
    wherein the step of counting the number of pulses comprises counting the number of pulses in the second set of pulses during the time interval.

11. An error checking method for use with a rotating member having a two channel encoder mounted in proximity thereto that produces signals from a first channel and a second channel, each producing pulses, the method comprising the steps of:
    receiving the signals from the first and second channels;
    determining a counting time interval;
    attempting to detect a rising edge and a falling edge for one of the pulses in the signal from each channel during the time interval;
    determining if both the rising and falling edges of both pulses are detected within the counting time interval; and
    detecting an error if the rising and falling edges of both pulses are not detected within the counting time interval.

12. The method of claim 11 further including the steps of determining a rotational speed of the rotating member, and performing the error checking only if the rotational speed is greater than a predetermined minimum threshold speed.

13. The method of claim 11 wherein the step of determining the time interval includes determining the time interval based upon the rotational velocity and rotational acceleration of the rotating member.

14. An error checking method for use with a rotating member having a two channel encoder mounted in proximity thereto that produces signals from a first channel and a second channel, each producing pulses, the method comprising the steps of:

receiving the signals from one of the first and second channels;

determining the rotational velocity of the rotating member;

comparing the rotational velocity to a predetermined high speed threshold;

determining a counting time interval;

converting the rising edges and the falling edges of the pulses from the one of the first and second channels to a second set of pulses, one pulse in the second set for each of the rising and falling edges, if the rotational velocity is greater than the predetermined high speed threshold;

counting the number of pulses in the second set of pulses during the time interval;

comparing the number of pulses counted to a predetermined expected number of pulses; and detecting an error if the number of pulses counted is not equal to the expected number of pulses.

* * * * *